(12) United States Patent
Minotani et al.

(10) Patent No.: US 12,489,404 B2
(45) Date of Patent: Dec. 2, 2025

(54) TRANSMISSION INTERFACE AND TRANSMITTER

(71) Applicant: NTT, Inc., Tokyo (JP)

(72) Inventors: Tadashi Minotani, Tokyo (JP); Toshiki Kishi, Tokyo (JP); Masatoshi Tobayashi, Yokohama (JP); Yoshikazu Urabe, Yokohama (JP); Nobuhiro Toyoda, Yokohama (JP)

(73) Assignees: NTT, INC., Tokyo (JP); NTT INNOVATIVE DEVICES CORPORATION, Yokohama (JP)

( * ) Notice: Subject to any disclaimer, the term of this patent is extended or adjusted under 35 U.S.C. 154(b) by 85 days.

(21) Appl. No.: 18/550,755

(22) PCT Filed: Mar. 25, 2022

(86) PCT No.: PCT/JP2022/014542
§ 371 (c)(1),
(2) Date: Sep. 15, 2023

(87) PCT Pub. No.: WO2022/203058
PCT Pub. Date: Sep. 29, 2022

(65) Prior Publication Data
US 2024/0160236 A1 May 16, 2024

(30) Foreign Application Priority Data
Mar. 25, 2021 (JP) .................................. 2021-051318

(51) Int. Cl.
*H03F 1/26* (2006.01)
*H03F 1/30* (2006.01)

(52) U.S. Cl.
CPC .............. *H03F 1/26* (2013.01); *H03F 1/301* (2013.01); *H03F 2200/18* (2013.01)

(58) Field of Classification Search
None
See application file for complete search history.

(56) References Cited

U.S. PATENT DOCUMENTS 4,686,487 A * 8/1987 Radovsky ............... H03F 3/345
330/288
6,701,138 B2 * 3/2004 Epperson ............. H03G 3/3047
330/133

(Continued)

FOREIGN PATENT DOCUMENTS

| JP | S57112089 A | 7/1982 |
| JP | 2004047832 A | 2/2004 |
| WO | 2018074410 A1 | 4/2018 |

OTHER PUBLICATIONS

Atsushi Takai, "Optical transmission technology that supports data centers—Hyperscale data center edition" https://eetimes.jp/ee/articles/1809/20/news011_4.html, Sep. 20, 2018, 5 pages. As discussed in the specification.

*Primary Examiner* — Thomas J. Hiltunen
(74) *Attorney, Agent, or Firm* — Slater Matsil, LLP

(57) ABSTRACT

The transmission interface includes a plurality of transmitters, wherein the transmitters are provided with: a power supply terminal shared by the plurality of transmitters, configured to receive a ground voltage; a bias terminal configured to receive a bias voltage; signal terminals configured to receive a signal voltage; a power supply fluctuation inverting bias unit to which a ground voltage and a bias voltage are applied, and which outputs the ground voltage making its fluctuation 180 degrees out of phase; a modulation unit to which the output of the power supply fluctuation inverting bias unit and a signal voltage are applied, and which outputs the opposite phase ground voltage making its fluctuation in phase; and a laser diode to which the ground voltage and the output of the modulation unit are applied.

10 Claims, 3 Drawing Sheets

(56) References Cited

U.S. PATENT DOCUMENTS

| | | | |
|---|---|---|---|
| 7,253,677 B1* | 8/2007 | Kuramochi | G05F 3/205 |
| | | | 327/535 |
| 8,660,208 B2* | 2/2014 | Brillant | H04L 27/36 |
| | | | 329/304 |
| 9,214,929 B2* | 12/2015 | Wang | H03K 5/08 |
| 9,294,042 B2* | 3/2016 | Scott | H03F 1/0227 |
| 9,444,415 B2* | 9/2016 | Folkmann | H03F 3/19 |
| 9,634,616 B2* | 4/2017 | Nan | H03F 1/26 |
| 10,218,310 B2* | 2/2019 | Arfaei Malekzadeh | |
| | | | H03F 3/45188 |
| 2005/0067698 A1 | 3/2005 | Aruga et al. | |
| 2012/0045202 A1* | 2/2012 | Jiang | H04B 10/40 |
| | | | 398/136 |
| 2019/0245624 A1 | 8/2019 | Kishi et al. | |

\* cited by examiner

TRANSMISSION INTERFACE AND TRANSMITTER

CROSS-REFERENCE TO RELATED APPLICATIONS

This patent application is a national phase entry of PCT Application No. PCT/JP2022/014542, filed on Mar. 25, 2022, which claims priority to Japanese Patent Application No. 2021-051318, filed on Mar. 25, 2021. Both of the aforementioned applications are hereby incorporated by reference in their entireties.

TECHNICAL FIELD

The present invention relates to a transmission interface and a transmitter comprising a plurality of transmitters.

BACKGROUND

In order to improve data processing capabilities of a computer, it is necessary to send and receive to and from the computer a large amount of data. Using a large number of high-speed interfaces, such as interfaces for optical communications, is viewed as a promising technique for sending and receiving such a large amount of data (Non-patent literature 1).

When a large number of high-speed interfaces are used, signal interference between adjacent high-speed interfaces poses a problem. One of the causes of the signal interference between adjacent interfaces is signal interference via a power source common to the interfaces. Such interference becomes significant when the high-speed interfaces are densely implemented. Accordingly, it is required to suppress such interference when high-speed interfaces are integrated adjacent to a CPU or a GPU chip, which is a processing unit of a computer.

FIG. 3 shows a conventional transmission interface 20. A ground voltage and a bias voltage are supplied to each transmitter 201_1 to 201_N from a common power supply 1 and a biasing power supply 3, respectively. Meanwhile, a signal voltage is supplied to each transmitter 201_1 to 201_N individually from the signal sources 4_1 to 4_N. The modulating transistor 231 of the modulating unit 23 is biased with the bias voltage, and the input of the modulating transistor 231 is modulated with the signal voltage such that the conductance of the modulating transistor 231 is modulated. Moreover, the ground voltage is split into the modulating unit 23 and the laser diode 24 and is applied to the modulating unit 23 and the laser diode 24.

When the conductance of the modulating transistor 231 is modulated, the voltage applied to the laser diode 24 changes also. This change causes the current flowing through the laser diode 24 to change and the output of the optical signal to change.

CITATION LIST

Non Patent Literature

Non-patent literature 1: https://eetimes.jp/ee/articles/1809/20/news011_4.html

SUMMARY

Technical Problem

Generally, the power supply 1 and the transmission interface 20 are connected via wiring, and therefore there is an inductance 2 associated with the wiring. For example, when the signal inputted to the transmitter 201_N causes to change the current flowing through the laser diode 24, the inductance 2 associated with the wiring causes fluctuation in the voltage on the power supply terminal 251 (solid arrow A in FIG. 3). Arrows A-C in FIG. 3 schematically illustrate the changing direction in the voltage herein.

In a transmitter 201_1 having a power supply terminal 251 common to the transmitter 201_N, the modulating unit 23 is biased regardless of the fluctuation in the ground voltage of the power supply 1, and therefore the conductance on the modulating transistor 231 is not correlated with the fluctuation in the ground voltage of the power supply 1 (dotted line arrow B in FIG. 3).

Meanwhile, the fluctuation in the ground voltage on the power supply 1 is conveyed to the laser diode 24, and the optical signal also changes in accordance with the fluctuation in the power supply (solid arrow C in FIG. 3).

Accordingly, since the changing ground voltage is superimposed on the signal voltage of the modulating unit 23, not correlated with the fluctuation in the ground voltage, the optical signal is affected by the fluctuation in the ground voltage. Thus, there is a problem that the signal fluctuation on any one of the transmitters (e.g., transmitter 201_N) is conveyed to another transmitter (e.g., transmitter 201_1), resulting in interference between the transmitters.

An object of embodiments of the present invention is to provide a transmission interface and a transmitter that can suppress fluctuation in the voltage applied to the laser diode and suppress interference between adjacent transmitters among parallelized optical communication transmitters.

Solution to Problem

In order to solve the above-described problem, a transmission interface according to embodiments of the present invention is a transmission interface including a plurality of transmitters, the transmitters comprising:
  a power supply terminal which is common to the plurality of transmitters, and configured to receive a ground voltage;
  a bias terminal configured to receive a bias voltage;
  a signal terminal configured to receive a signal voltage;
  a power supply fluctuation inverting bias unit to which the ground voltage and the bias voltage are applied, and configured to output the fluctuation in the ground voltage in opposite phase;
  a modulating unit to which the output of the power supply fluctuation inverting bias unit and the signal voltage are applied, and configured to output the inverted-phase fluctuation in the ground voltage by making the fluctuation in phase; and
  a laser diode to which the ground voltage and the output of the modulating unit are applied.

Advantageous Effects of Embodiments of the Invention

In accordance with the present invention, it is possible to provide a transmission interface and a transmission device that can suppress the fluctuation in the voltage applied to the laser diode.

DETAILED DESCRIPTION OF ILLUSTRATIVE EMBODIMENTS

First Embodiment

A transmission interface and a transmission device according to the first embodiment of the present invention will be described with reference to FIGS. 1 and 2.

Configuration of the Transmission Interface

Figure 1:
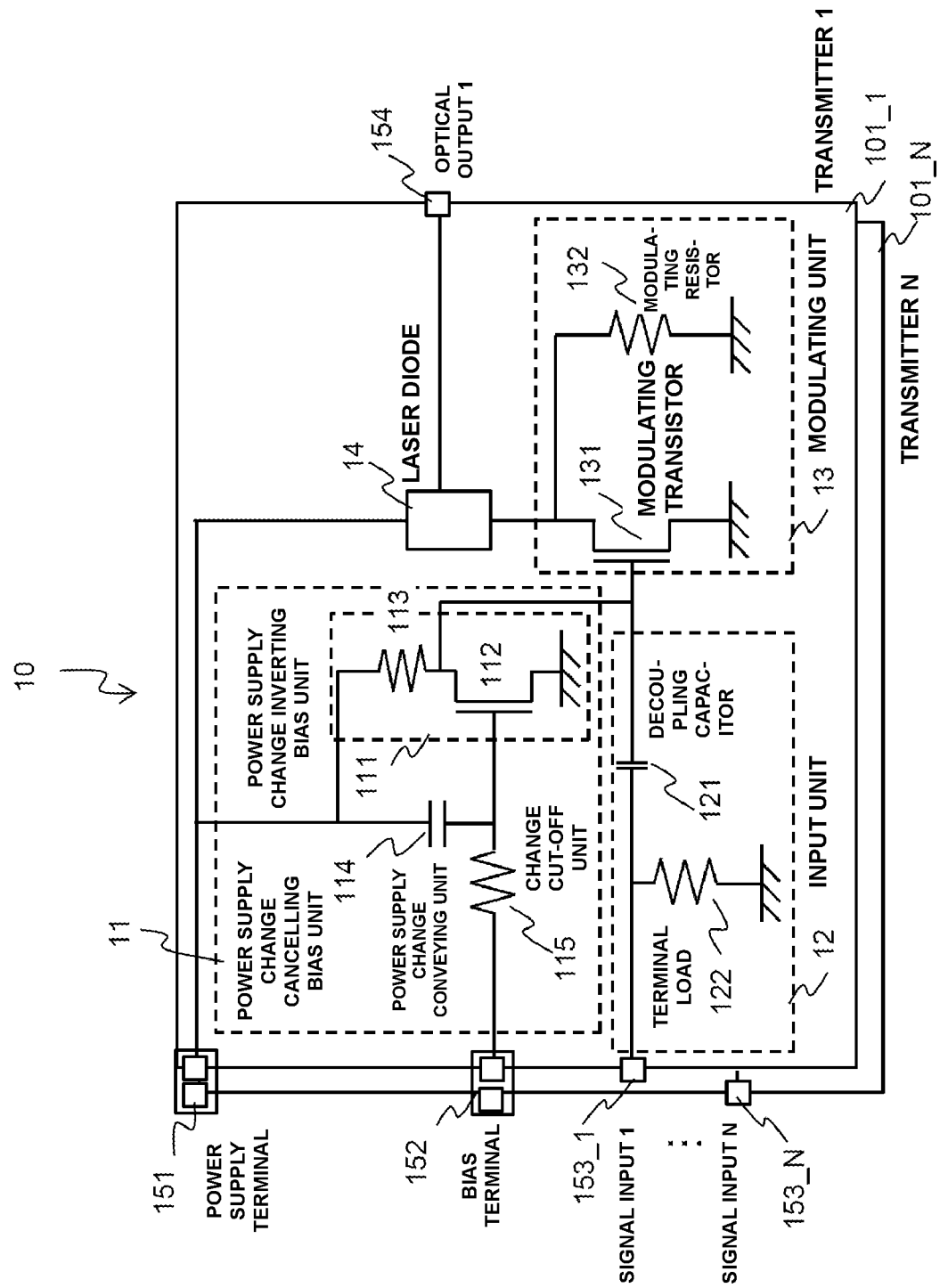
FIG. 1 shows a block diagram illustrating a configuration of a transmission interface according to a first embodiment of the present invention.

As shown in FIG. 1, the transmission interface 10 according to the present embodiment includes N transmitters 101_1 to 101_N, each transmitter including a power supply fluctuation cancelling bias unit 11, an input unit 12, a modulating unit 13, and a laser diode 14.

The power supply fluctuation cancelling bias unit 11 includes a power supply fluctuation inverting bias unit in, a power supply fluctuation conveying unit 114, and a fluctuation cut-off unit 115. The power supply fluctuation inverting bias unit 111 includes a fluctuation inverting transistor 112 and a resistor 113, wherein the drain of the fluctuation inverting transistor 112 is connected to one end of the resistor 113 and the gate of the modulating transistor 131 in the modulating unit 13, and the source of the fluctuation inverting transistor 112 is connected to ground. The other end of the resistor 113 is connected to the power supply terminal 151.

The power supply fluctuation conveying unit 114 and the fluctuation cut-off unit 115 are connected in parallel to the gate of the fluctuation inverting transistor 112. The fluctuation inverting transistor 112 may be an n-type metal oxide semiconductor field effect transistor (N-type MOSFET or NMOS), a P-type MOSFET (PMOS), or other FETs.

The power supply fluctuation inverting bias unit 111 biases the modulating unit 13 on the basis of the voltage of the bias terminal 152 and inverts the fluctuation in the ground voltage of the power supply 1 to apply the inverted fluctuation to the modulating unit 13.

The power supply fluctuation conveying unit 114 is connected to the power supply terminal 151 and conveys the fluctuation in the ground voltage of the power supply 1 to the power supply fluctuation inverting bias unit 111. Capacitance circuits such as capacitors or transistor circuits may be used in the power supply fluctuation conveying unit 114.

The fluctuation cut-off unit 115 is connected to the bias terminal 152 so as to isolate the conveyed ground voltage of the power supply 1 from the voltage on the bias terminal 152. A resistor or a diode may be used for the fluctuation cut-off unit 115.

In the input unit 12, a decoupling capacitance circuits 121 and a termination load 122 are connected in parallel to each other.

The modulating unit 13 includes a modulating transistor 131 and a modulating resistor 132. The output of the power supply fluctuation canceling bias unit 11 and the output of the input unit 12 are inputted to the gate of the modulating transistor 131. The source of the modulating transistor 131 is connected to ground. The modulating resistor 132 is connected to the drain of the modulating transistor 131. The output of the modulating unit 13 is applied to the laser diode 14.

The laser diode 14 is biased with (applied) the ground voltage supplied from the power supply terminal 151 and a voltage inputted from the modulating unit 13 so as to output optical signals.

Figure 2:
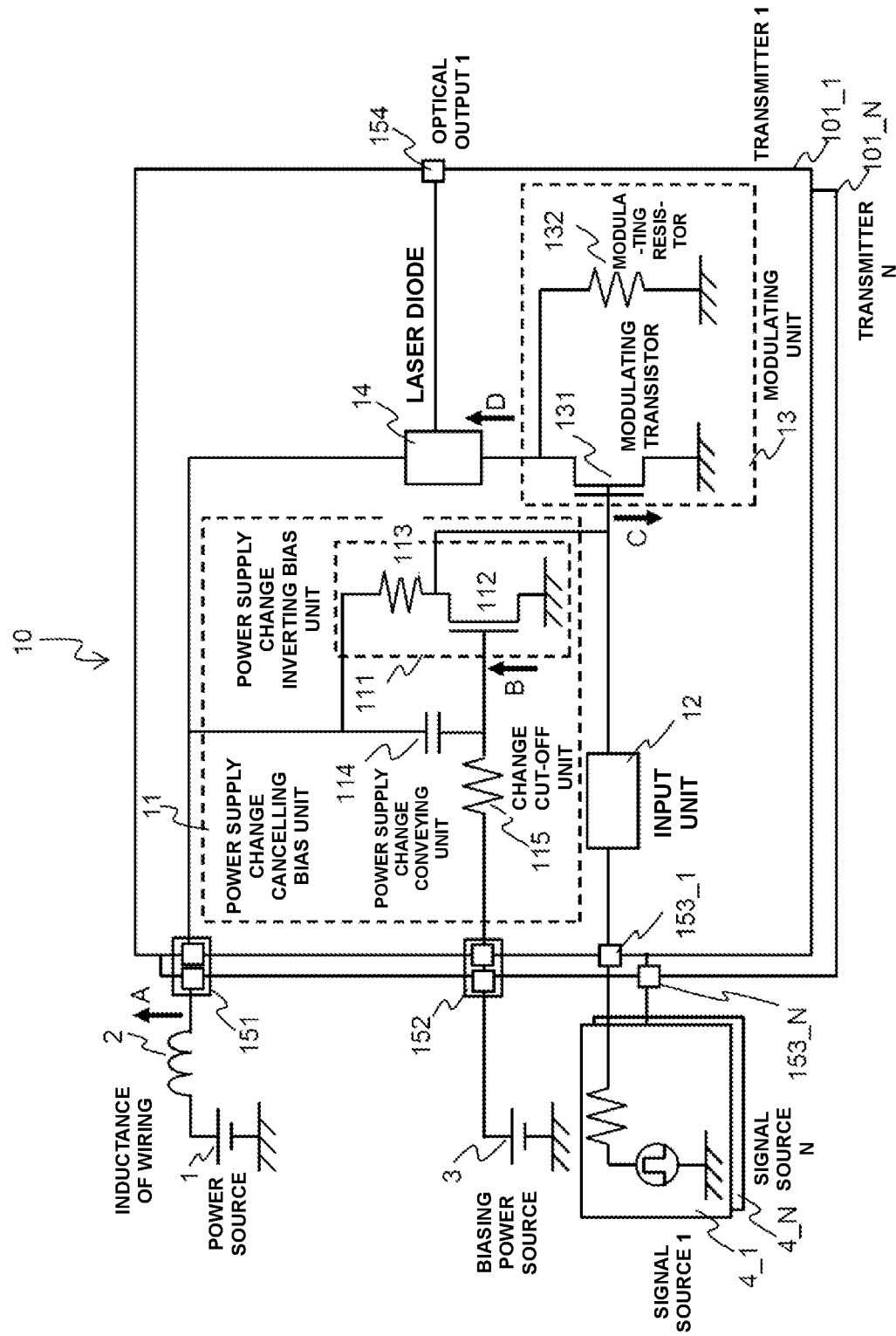
FIG. 2 shows a block diagram illustrating a configuration of a transmission device having the transmission interface according to the first embodiment of the present invention.
Figure 3:
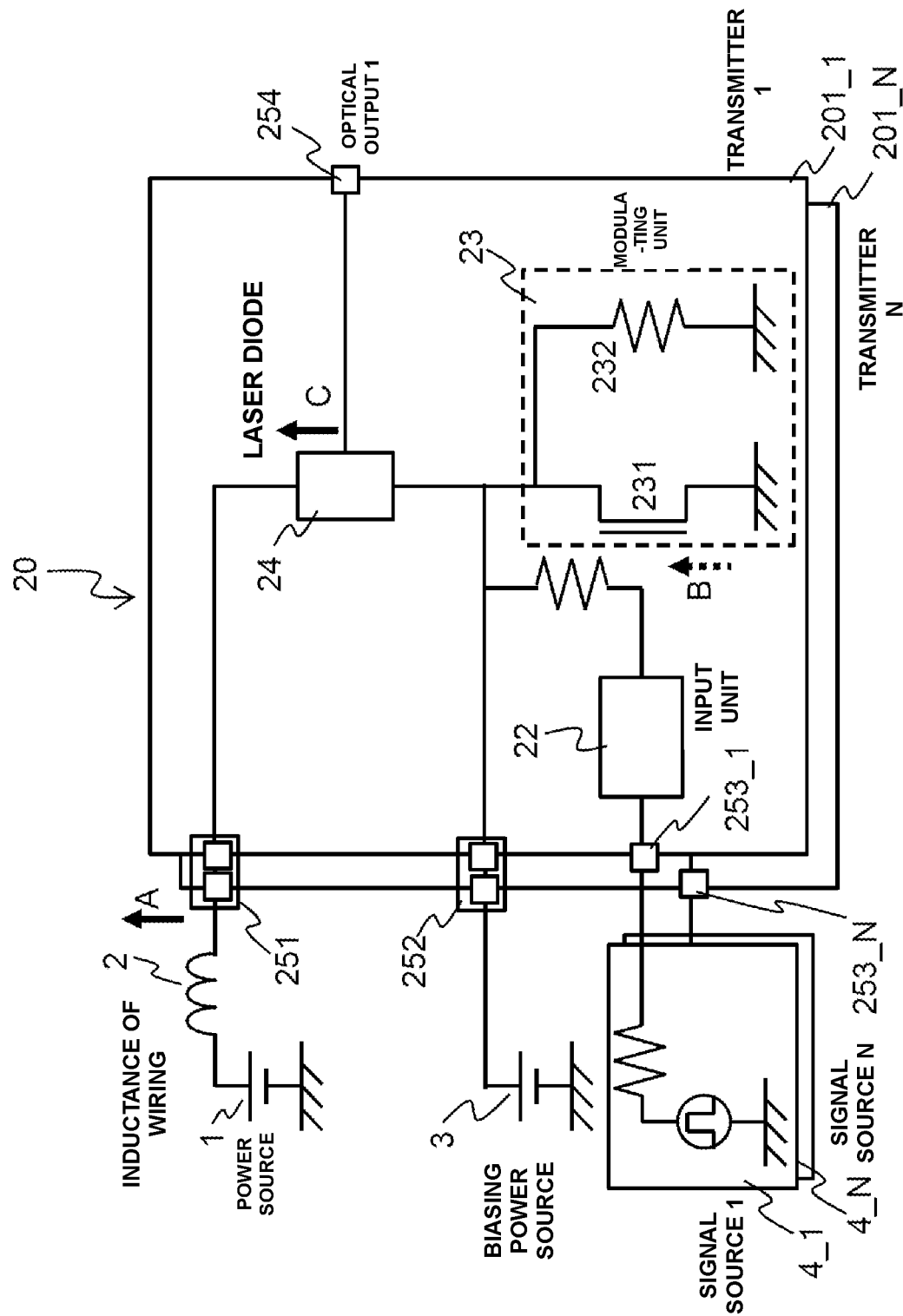
FIG. 3 shows a block diagram illustrating a configuration of a transmission device having a conventional transmission interface.

The transmission interface 10 according to the present embodiment is applied to the transmission device as shown in FIG. 2. The ground voltage and the bias voltage are supplied to each transmitter 101_1 to 101_N in the transmission interface 10 from the power source 1 common to the respective transmitters 101_1 to 101_N, and the biasing power supply 3, respectively. Meanwhile, the signal voltage is supplied to each transmitter 101_1 to 101_N individually from the signal sources 4_1 to 4_N.

The power supply terminals 151 of the respective transmitters connected via the power supply 1 and the wiring (inductance) 2 are common to the transmitters 101_1 to 101_N herein. Moreover, the bias terminals 152 of each transmitter connected to the biasing power supply 3 are common to the transmitters 101_1 to 101_N. The signal terminals 153_1 to 153_N are connected to the signal sources 4_1 to 4_N, respectively.

Operation of the Transmission Interface

In the transmission interface 10 according to the present embodiment, a bias voltage is inputted to the power supply fluctuation inverting bias unit in from the biasing power supply 3, and the modulating transistor 131 of the modulating unit 13 is biased with the voltage generated in the power supply fluctuation inverting bias unit 111. The output (voltage) of the modulating transistor 131 is applied to the laser diode 14.

At this time, when a signal inputted to any one of the transmitters (e.g., transmitter 101_N) first causes fluctuation in the current flowing through the laser diode 14, the inductance 2 of the wiring initially causes fluctuation in the voltage of the power supply terminal 151 (solid arrow A in FIG. 2). Arrows A-D in FIG. 2 schematically illustrate the changing direction in the voltage herein.

Next, in other transmitters (e.g., transmitter 101_1) having a power supply terminal 151 common to the transmitter 101_N, the fluctuation in the ground voltage from the power supply 1 is inputted to the power supply fluctuation inverting bias unit 111 in phase by the power supply fluctuation conveying unit 114 of the power supply fluctuation cancelling bias unit 11 (solid arrow B in FIG. 2). Here, a bias voltage from the bias terminal 152 is inputted to the gate of the NMOS 112 of the power supply fluctuation inverting bias unit 111 together with the changing component of the ground voltage.

Next, in the NMOS 112 of the power supply fluctuation inverting bias unit in, the voltage at the drain drops as the voltage at the gate increases, and therefore the fluctuation in the ground voltage that is inputted in phase has opposite phase so as to be output to the gate of the modulating transistor 131 (solid arrow C in FIG. 2). Thus, the power supply fluctuation inverting bias unit 111 outputs a voltage including the opposite phase changing component of the ground voltage.

Next, the output of the power supply fluctuation inverting bias unit in and the signal voltage from the signal terminal 153_1 are applied to the gate of the modulating transistor 131 of the modulating unit 13. Here, the voltage of the drain falls as the voltage of the gate increases, and therefore the fluctuation in the ground voltage inputted in opposite phase becomes in phase. Thus, the modulating unit 13 outputs a voltage including the in phase changing component of the ground voltage to the laser diode 14 (arrow D in FIG. 2).

Finally, the ground voltage from the power supply terminal 151 and the output of the modulating unit 13 are applied to the laser diode 14 so as to transmit optical signals.

Thus, when the ground voltage fluctuates in the voltage applied to the laser diode 14, the output of the modulating unit 13 fluctuates in phase with the fluctuation in the ground voltage also.

As a result, the difference between the ground voltage and the output voltage of the modulating unit 13 is applied to the laser diode 14, and therefore fluctuations in the voltage applied to the laser diode 14 are suppressed. Therefore, fluctuations in optical signals due to the fluctuations in the ground voltage of the power supply 1 are suppressed.

Thus, in accordance with the transmission interface according to the present embodiment, fluctuations in the voltage applied to the laser diode can be suppressed, and therefore interference between adjacent transmitters among the parallelized optical communication transmitters can be suppressed.

Although examples of a plurality of transmitters having a common bias terminal are described in the embodiments of the present invention, each of the plurality of transmitters may have a separate bias terminal.

Although examples of a plurality of transmitters each having a separate signal terminal are described in the embodiments of the present invention, the present invention is not limited thereto and a plurality of transmitters may have a common signal terminal.

Although examples in which a transmitter 101_1 operates among a plurality of transmitters are described in the embodiments of the present invention, other transmitters have similar configurations and operate in the same manner.

In the embodiments of the present invention, examples of the structure, dimensions, materials, and the like are shown in the configuration of the transmission interface, the manufacturing method, and the like, but the present invention is not limited thereto. Having the functions of the transmission interface and having the advantageous effects of the transmission interface are sufficient to be within the scope of the present invention.

INDUSTRIAL APPLICABILITY

Embodiments of the present invention relate to a connection circuit for connecting to a transmission circuit and can be applied to communication transmission systems.

REFERENCE SIGNS LIST

10 transmission interface
101_1 to 101_N transmitter
151 power supply terminal
152 bias terminal
153_1 to 153_N signal terminal
11 power supply fluctuation cancelling bias unit
111 power supply fluctuation inverting bias unit
12 input unit
13 modulating unit
14 laser diode

The invention claimed is:

1. A transmission interface comprising:
a plurality of transmitters, each of the plurality of transmitters comprising:
 a power supply terminal which is common to the plurality of transmitters, and configured to receive a first voltage;
 a bias terminal configured to receive a second voltage;
 a signal terminal configured to receive a signal voltage;
 a power supply fluctuation inverting bias circuit to which the first voltage and the second voltage are applied, the power supply fluctuation inverting bias circuit being configured to make a fluctuation in the first voltage in opposite phase and output an inverted-phase fluctuation in the first voltage;
 a modulating circuit to which the output of the power supply fluctuation inverting bias circuit and the signal voltage are applied, and configured to output an output which corresponds to the signal voltage and in which the fluctuation in the first voltage is superimposed in phase; and
 a laser diode to which the first voltage and an output of the modulating circuit are applied, wherein
 the power supply fluctuation inverting bias circuit includes
  a resistor having a terminal connected to the power supply terminal, and
  a fluctuation inverting transistor having a source connected to ground, a drain connected to the other terminal of the resistor, and a gate receiving the second voltage and the inverted-phase fluctuation in the first voltage; and
 the modulating circuit includes
  a modulating resistor having one of the ends connected to ground; and
  a modulating transistor having a gate connected to the other end of the resistor and the drain of the fluctuation inverting transistor, a source connected to ground, and a drain connected to the other end of the modulating resistor, and configured to output the output of the modulating circuit.

2. The transmission interface according to claim 1 further comprising:
 a power supply fluctuation conveying circuit connected to the power supply terminal;
 a fluctuation cut-off circuit connected to the bias terminal; and
 an input circuit connected to the signal terminal, wherein
 the power supply fluctuation conveying circuit and the fluctuation cut-off circuit are connected to the gate of the fluctuation inverting transistor; and
 a drain of the fluctuation inverting transistor and the input circuit are connected to the gate of the modulating transistor.

3. The transmission interface according to claim 2, wherein the input circuit comprises:
 a capacitance circuit connected between the signal terminal and the gate of the modulating transistor; and
 a termination load connected to an input terminal of the capacitance circuit.

4. A transmitter comprising:
a transmission interface comprising a plurality of transmitters, each of the plurality of transmitters comprising:
 a power supply terminal which is common to the plurality of transmitters, and configured to receive a first voltage;
 a bias terminal configured to receive a second voltage;
 a signal terminal configured to receive a signal voltage;
 a power supply fluctuation inverting bias circuit to which the first voltage and the second voltage are applied, the power supply fluctuation inverting bias circuit being configured to make a fluctuation in the first voltage in opposite phase and output an inverted-phase fluctuation in the first voltage;

a modulating circuit to which the output of the power supply fluctuation inverting bias circuit and the signal voltage are applied, and configured to output an output which corresponds to the signal voltage and in which the fluctuation in the first voltage is superimposed in phase; and a laser diode to which the first voltage and an output of the modulating circuit are applied;

a first power supply connected to the power supply terminal;

a second power supply connected to the bias terminal; and a plurality of signal sources respectively connected to the signal terminals of the plurality of transmitters, wherein the power supply fluctuation inverting bias circuit includes a resistor having a terminal connected to the power supply terminal, and a fluctuation inverting transistor having a source connected to ground, a drain connected to the other terminal of the resistor, and a gate receiving the second voltage and the inverted-phase fluctuation in the first voltage; and the modulating circuit includes a modulating resistor having one of the ends connected to ground; and a modulating transistor having a gate connected to the other end of the resistor and the drain of the fluctuation inverting transistor, a source connected to ground, and a drain connected to the other end of the modulating resistor, and configured to output the output of the modulating circuit.

5. The transmitter according to claim 4 wherein the transmission interface further comprises:

a power supply fluctuation conveying circuit connected to the power supply terminal;

a fluctuation cut-off circuit connected to the bias terminal; and an input circuit connected to the signal terminal, wherein the power supply fluctuation conveying circuit and the fluctuation cut-off circuit are connected to the gate of the fluctuation inverting transistor; and a drain of the fluctuation inverting transistor and the input circuit are connected to the gate of the modulating transistor.

6. The transmitter according to claim 5, wherein the input circuit further comprises:

a capacitance circuit connected between the signal terminal and the gate of the modulating transistor; and a termination load connected to an input terminal of the capacitance circuit.

7. A transmitter comprising:

a power supply terminal configured to receive a first voltage;

a bias terminal configured to receive a second voltage;

a signal terminal configured to receive a signal voltage;

a power supply fluctuation inverting bias circuit to which the first voltage and the second voltage are applied, the power supply fluctuation inverting bias circuit being configured to make a fluctuation in the first voltage in opposite phase and output an inverted-phase fluctuation in the first voltage;

a modulating circuit to which the output of the power supply fluctuation inverting bias circuit and the signal voltage are applied, and configured to output an output which corresponds to the signal voltage and in which the fluctuation in the first voltage is superimposed in phase; and a laser diode to which the first voltage and an output of the modulating circuit are applied, wherein the power supply fluctuation inverting bias circuit includes a resistor having a terminal connecte to the power supply terminal, and a fluctuation inverting transistor having a source connected to ground, a drain connected to the other terminal of the resistor, and a gate receiving the second voltage and the inverted-phase fluctuation in the first voltage; and the modulating circuit includes a modulating resistor having one of the ends connected to ground; and a modulating transistor having a gate connected to the other end of the resistor and the drain of the fluctuation inverting transistor, a source connected to ground, and a drain connected to the other end of the modulating resistor, and configured to output the output of the modulating circuit.

8. The transmitter according to claim 7, wherein the power supply terminal is common to a plurality of transmitters.

9. The transmitter according to claim 8 wherein the transmitter further comprises:

a power supply fluctuation conveying circuit connected to the power supply terminal;

a fluctuation cut-off circuit connected to the bias terminal; and an input circuit connected to the signal terminal, wherein the power supply fluctuation conveying circuit and the fluctuation cut-off circuit are connected to the gate of the fluctuation inverting transistor; and a drain of the fluctuation inverting transistor and the input circuit are connected to the gate of the modulating transistor.

10. The transmitter according to claim 9, wherein the input circuit further comprises:

a capacitance circuit connected between the signal terminal and the gate of the modulating transistor; and a termination load connected to an input terminal of the capacitance circuit.

\* \* \* \* \*